United States Patent
Ou et al.

(10) Patent No.: US 11,121,629 B2
(45) Date of Patent: Sep. 14, 2021

(54) REGULATOR DEVICE AND CONTROL METHOD THEREOF

(71) Applicant: Realtek Semiconductor Corporation, Hsinchu (TW)

(72) Inventors: Wei-Wen Ou, Hsinchu County (TW); Shih-Chieh Chen, Yilan (TW); Chien-Sheng Chen, Zhubei (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/504,494

(22) Filed: Jul. 8, 2019

(65) Prior Publication Data
US 2020/0136509 A1    Apr. 30, 2020

(30) Foreign Application Priority Data
Oct. 26, 2018    (TW) .................................. 107138054

(51) Int. Cl.
*H02M 3/158*    (2006.01)
*H02M 1/08*    (2006.01)

(52) U.S. Cl.
CPC ............. *H02M 3/158* (2013.01); *H02M 1/08* (2013.01)

(58) Field of Classification Search
CPC ......... H02M 2003/1566; H02M 3/157; H02M 2001/0029; H02M 1/08; H02M 1/38
See application file for complete search history.

(56) References Cited

U.S. PATENT DOCUMENTS

| | | | |
|---|---|---|---|
| 8,970,199 B2 * | 3/2015 | Scoones ................... | H02M 1/32 323/285 |
| 2012/0043950 A1 * | 2/2012 | Truong .................. | H02M 3/158 323/282 |
| 2019/0222121 A1 * | 7/2019 | Hallikainen ............ | G05F 3/262 |
| 2019/0238129 A1 * | 8/2019 | Fukushima ........... | H02M 3/158 |

OTHER PUBLICATIONS

Merriam-Webster, "accord", "according"; "accords" Definition by Merriam-Webster.*

* cited by examiner

*Primary Examiner* — Alex Torres-Rivera
(74) *Attorney, Agent, or Firm* — Locke Lord LLP; Tim Tingkang Xia, Esq.

(57) ABSTRACT

A regulator device includes a first switch, a second switch, and a controlling circuit. A control terminal of the first switch is configured to receive a first control signal. A first terminal of the second switch is coupled with a second terminal of the first switch at a node. A control terminal of the second switch is configured to receive a second control signal. The controlling circuit is coupled to the control terminal of the first switch, the control terminal of the second switch, and the node. The controlling circuit outputs the first control signal with a first slope to the first switch during a first period, and outputs the first control signal with a second slope to the first switch during a second period. The first period is less than the second period, and the first slope is larger than the second slope.

14 Claims, 3 Drawing Sheets

REGULATOR DEVICE AND CONTROL METHOD THEREOF

CROSS-REFERENCE TO RELATED APPLICATION

This application claims priority to Taiwan Application Serial Number 107138054, filed on Oct. 26, 2018, which is herein incorporated by reference.

BACKGROUND

Field of Disclosure

The disclosure relates to a voltage converting device and control method, and, more particularly, to a regulator device and control method thereof.

Description of Related Art

In general regulator devices, inverters which have multi-stage amplifiers are used for driving output switches, to increase efficiency and reduce losses of the switches. However, because it is uncertain that the driving signals of driving switches changes, there is a problem of the input voltage with sudden high voltage level generated by the regulator switch device while heavy load situation. Consequently, it will reduce the lifecycle of the integrated circuit due to the frequent-generating sudden high voltage level.

SUMMARY

An aspect of the present disclosure is to provide a regulator device. The regulator device includes a first switch, a second switch, and a controlling circuit. A control terminal of the first switch is configured to receive a first control signal. A first terminal of the second switch is coupled with the second terminal of the first switch at a node. The control terminal of the second switch is configured to receive a second control signal. The controlling circuit is coupled to the control terminal of the first switch, the control terminal of the second switch and the node. When the regulator device is at a heavy load status, the controlling circuit outputs the first control signal with a first slope to the first switch during a first period, and outputs the first control signal with a second slope to the first switch during a second period, wherein the first period is less than the second period, and the first slope is larger than the second slope.

Another aspect of the present disclosure is to provide a method for controlling regulator device, which applies to a regulator device, the regulator device includes a first switch, a second switch, and a controlling circuit, a control terminal of the first switch configured to receive a first control signal, a first terminal of the second switch coupled with the second terminal of the first switch at a node, a control terminal of the second switch configured to receive a second control signal, the method includes the steps: outputting, by the controlling circuit, the first control signal with a first slope to the first switch during a first period in response to a heavy load status of the regulator device; and outputting, by the controlling circuit, the first control signal with a second slope to the first switch during a second period, wherein the first period is less than the second period, and the first slope is larger than the second slope.

Therefore, according the technical features of the present disclosure, the regulator device and the method for controlling regulator device output different control signal based on corresponding periods when they are at the heavy load status, for example, the control signal with smaller slope will be outputted during the second period to prevent occurring the sudden high voltage, hence the lifecycle of the integrated circuit could be enlarged.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
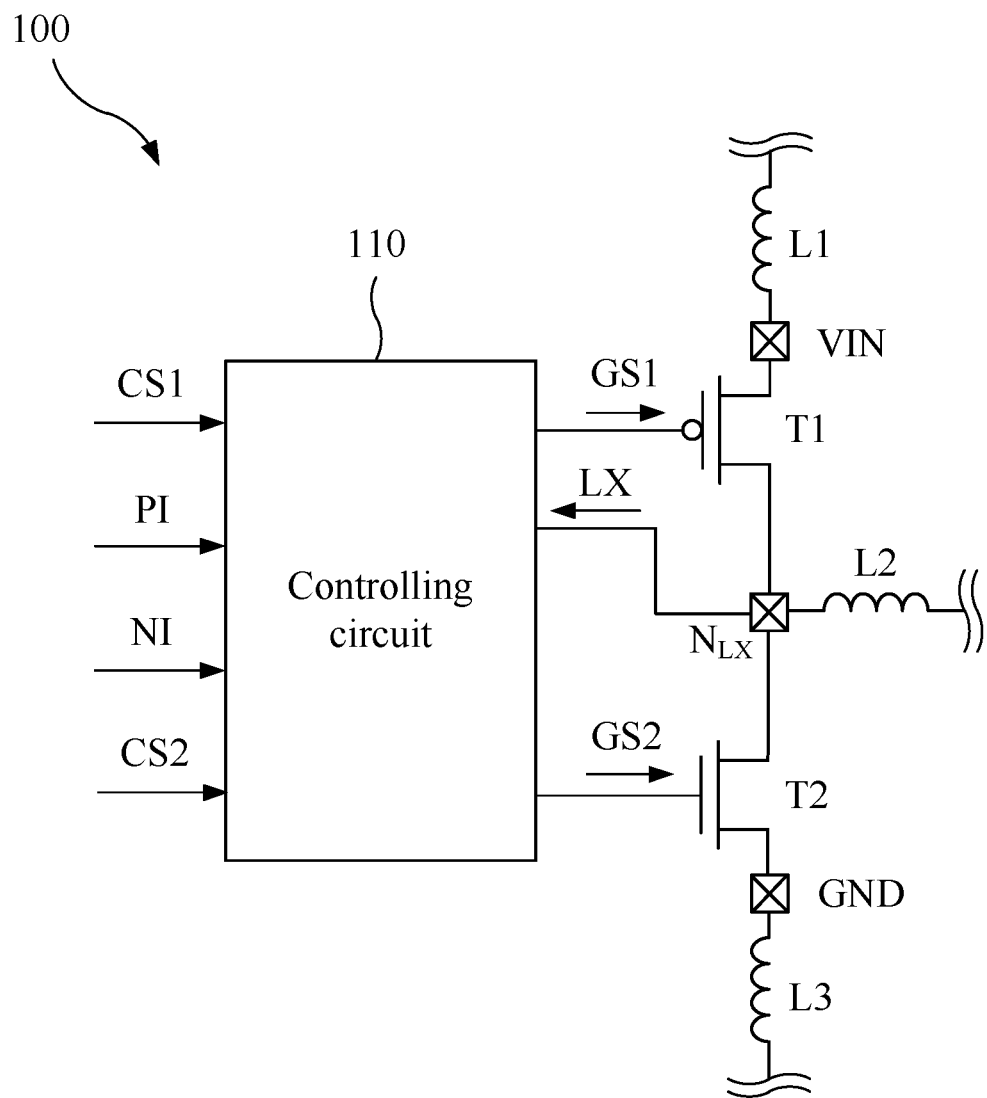
FIG. 1 is schematic diagram illustrating a regulator device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

FIG. 1 is schematic diagram illustrating a regulator device 100 according to some embodiments of the present disclosure. As illustrating in FIG. 1, the regulator device 100 includes a first switch T1, a second switch T2, and a controlling circuit 110. The first switch T1 includes a first terminal, a control terminal, and a second terminal, and the second switch T2 also includes a first terminal, a control terminal, and a second terminal.

Reference is made in FIG. 1, and the first terminal of the first switch T1 is configured to receive an input voltage VIN. The control terminal of the first switch T1 is configured to receive a first control signal GS1. The first terminal of the second switch T2 and the second terminal of the first switch T1 are coupled at a node NLX. The control terminal of the second switch T2 is configured to receive a second control signal GS2. The second terminal of the second switch T2 is coupled to a ground terminal GND. The controlling circuit 110 is coupled to the control terminal of the first switch T1, the control terminal of the second switch T2, and the node NLX.

Please refer to FIG. 1, the regulator device 100 is disposed on a die, and the die could be processed by packaging processing into an integrated circuit, and the integrated circuit could be disposed on a printed circuit board (PCB). A first terminal of the first transistor T1 (the upper terminal of the first transistor T1) of the regulator device 100 which is disposed on the die is coupled with a pin of the integrated circuit by means of a bonding wire, further, the integrated circuit is coupled with other entity by means of a printed circuit board trace. According to the coupling way, the bonding wire and the printed circuit board trace would generate a parasitic inductance. The parasitic inductance is represented as the inductance L1 of FIG. 1, similarly, the inductance L2, and L3 of FIG. 1 are also the parasitic inductance. When the regulator device 100 operates heavy load, on condition that switches of the regular device 100 are turned off quickly, there is a problem that input voltage VIN will increase suddenly (for example, the bounce phenomenon of the input voltage VIN) because the characteristic of the foresaid parasitic inductance L1, the phenomenon can be expressed by the following formula:

$$VIN(\max) = VIN + L\frac{di}{dt} \qquad \text{formula 1}$$

As the foresaid formula 1, on condition that the switches of the regulator device 100 are turned off quickly, the shorter time could lead to the larger input voltage VIN (max) and the problem of sudden high voltage could occur, such that the integrated circuit is to be in an overvoltage status and might be burned at some serious condition. To solve the above problem, the present disclosure provides technical features as below.

Figure 2:
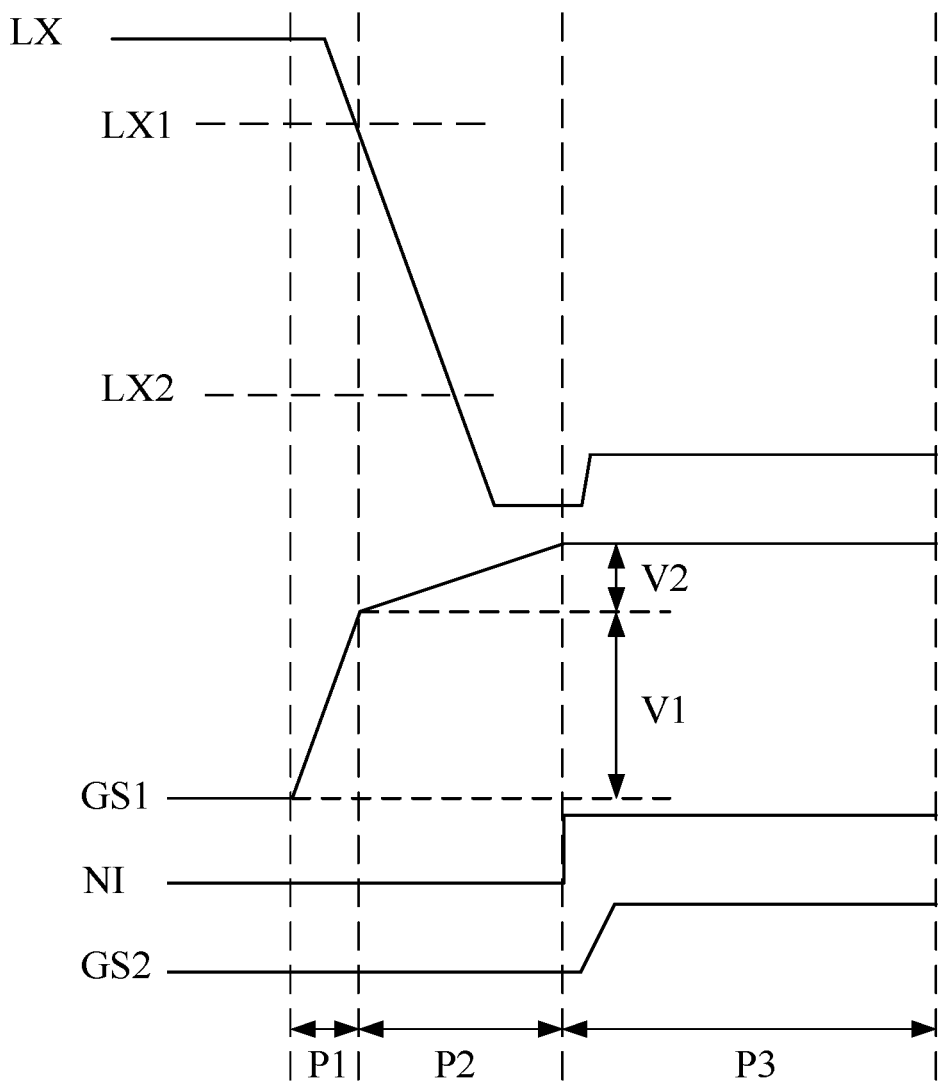
FIG. 2 is a schematic diagram of a waveform for the regulator device according to some embodiments of the present disclosure.

To make easier statements of the regulator device 100 of FIG. 1, please refer to FIG. 2 incorporating with FIG. 1. FIG. 2 is a schematic diagram of a waveform for the regulator device according to some embodiments of the present disclosure.

As shown in FIG. 1 and FIG. 2, when the regulator device 100 operates at the heavy load status, the controlling circuit 110 outputs a first control signal GS1 with a first slope to the first switch T1 during a first period P1 and outputs the first control signal GS1 with a second slope to the first switch T1 during the second period P2. As show in FIG. 2, the first period P1 is less than the second period P2, and the first slope is larger than the second slope.

Therefore, the regulator device 100 outputs the first control signal GS1 having larger slope during the first period P1, in order to turn off the first switch T1 quickly. Further, to avoid turning off the first switch T1 of the regulator device 100 quickly during the second period P2 which leads to sudden high voltage level of the input voltage VI, the regulator device 100 outputs the first control signal GS1 with lower slope at this time to decrease the speed that the first switch T1 is turned off, so that the situation that the input voltage VIN occurs the sudden high voltage level could be prevented.

In one embodiment, the detailed statements illustrates as below. Please refer to FIG. 1 incorporating with FIG. 2, when the controlling circuit 110 receives a disable signal PI for turning off the first switch T1, the first period P1 is entered. The controlling circuit 110 turns off the first switch T1 quickly by the first control signal GS1 with the first slope which is larger than the second slope during the first period P1. In other words, the controlling circuit 110 provides the first control signal GS1, which voltage increases fast, during the first period P1, to turn off the first switch T1 quickly.

In another embodiment, please refer to FIG. 1 and FIG. 2. The controlling circuit 110 is further configured to detect the voltage level LX of the node NLX. When the voltage level LX of the node NLX is equal to a first threshold voltage LX1, a second period P2 is entered. The controlling circuit 110 turns off the first switch T1 slowly by the first control signal GS1 with the second slope, which is less than the first slope during the second period P2. In other word, the controlling circuit 110 provides the first control signal GS1, which voltage increases slowly, during the second period P2, to avoid the sudden high voltage level of the input voltage.

In one embodiment, please refer to FIG. 1 and FIG. 2. The controlling circuit 110 is further configured to detect the voltage LX of the node NLX. When the voltage LX of the node NLX is equal to a second threshold voltage LX2, the controlling circuit 110 prepares outputting a second control signal GS2 for turning on the second switch T2.

In another embodiment, please refer to FIG. 1 and FIG. 2. When the controlling circuit 110 receives an enable signal NI for turning on the second switch T2, a third period P3 is entered. The controlling circuit 110 outputs the second control signal GS2 during the third period P3 to turn on the second switch T2, which the first control signal GS1 turns off the first switch T1 completely.

In one embodiment, please refer to FIG. 1 and FIG. 2. The first switch comprises a P-type transistor, and the second switch comprises an N-type transistor. The controlling circuit 110 provides the first control signal GS1 with a first voltage difference V1 to the first switch T1 during the first period P1. Then, the controlling circuit 110 provides the first control signal GS1 with a second voltage difference V2 to the first switch T1 during the second period P2. As shown in FIG. 2, the first voltage difference V1 is larger than the second voltage difference V2, therefore, the regulator device 100 could turn off the first switch T1 quickly during the first period P1, and the regulator device 100 could turn off the first switch T1 slowly during the second period P2, to prevent the situation that the input voltage VIN becomes high voltage level suddenly. However, the present disclosure is not limited to the circuit architecture in FIG. 1 and the waveform in FIG. 2, they are shown as the exemplary examples for the present disclosure. In other embodiments, for some practical situation, the first switch could be the N-type transistor and the second switch could be the P-type transistor, the control signals could be also appropriately changed without departing from the spirit of the present disclosure, and the appropriate transforms or changes also belong to the claims of the disclosure.

In another embodiment, please refer to FIG. 1 and FIG. 2. The first voltage difference V1 and the second voltage difference V2 are both the positive voltages. In other embodiments, the controlling circuit 110 provides the first control signal GS1 with the high level voltage to the first switch T1 during the third period P3 to turn off the first switch T1 completely.

In some embodiments, please refer to FIG. 1 and FIG. 2, the controlling circuit 110 provides the first control signal GS1 according to a pre-drive signal PDS. For example, the pre-drive signal PDS is the high level voltage signal during the first period P1. The controlling circuit 110 provides the first control signal GS1 with the first voltage difference V1 which has larger voltage difference accordingly. The pre-drive signal PDS is the low level voltage signal during the second period P2. The controlling circuit 110 provides the first control signal GS1 with the second voltage difference V2 which has smaller voltage difference accordingly. The pre-drive signal PDS is the high level voltage signal during the third period P3. The controlling circuit 110 provides the first control signal GS1 with high level voltage accordingly.

Figure 3:
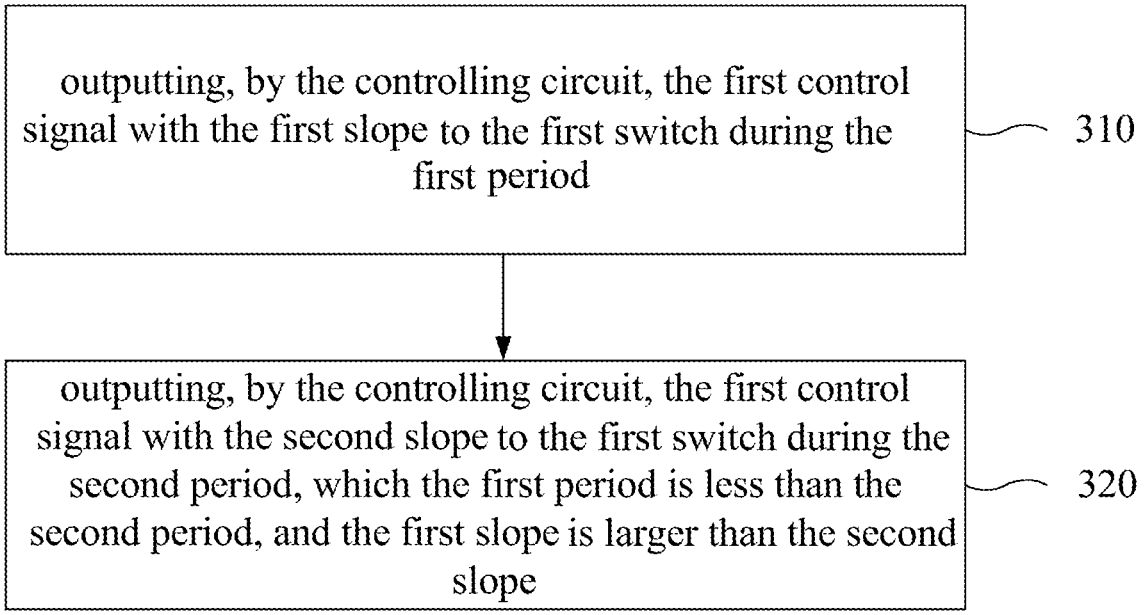
FIG. 3 is a flow diagram illustrating a control method suitable for the regulator device according to some embodiments of the present disclosure.

FIG. 3 is a flow diagram illustrating a control method 300 suitable for the regulator devices according to some embodiments of the present disclosure. The foresaid control method 300 for regulator devices includes the following steps:

In the step 310: outputting, by the controlling circuit, the first control signal with the first slope to the first switch during the first period; and In the step 320: outputting, by the controlling circuit, the first control signal with the second slope to the first switch during the second period, which the first period is less than the second period, and the first slope is larger than the second slope.

To make the illustration be easier realized for the control method 300 in FIG. 3, please refer to FIG. 3 incorporated FIG. 1. For example, in the step 310, when the regulator device 100 is at the heavy load status, the controlling circuit 110 outputs the first control signal GS1 with the first slope to the first switch T1. In the step 320, the controlling circuit 110 outputs the first control signal with the second slope to the first switch T1 during the second period P2. The foresaid first period P1 is less than the second period P2, and the first slope is larger than the second slope.

According to the control method 300 for regulator device 100, the regulator device 100 could output the first control signal GS1 which has larger slope during the first period P1 in order to turn off the first switch T1 quickly, and the regulator device 100 could output the first control signal GS1 which has smaller slope during the second period P2 in order to reduce the speed of turning off the first switch T1 and to avoid the input voltage VIN from sudden high voltage.

In one embodiment, the control method of the regulator device 100 further comprises: when the controlling circuit 110 receives the disable signal PI for turning off the first switch T1, the first period P1 is entered, meanwhile, the controlling circuit 110 turns off the first switch T1 quickly by using the control signal GS1 with larger slope during the first period P1. In another embodiment, the control method 300 of the regulator device 100 further comprises: the controlling circuit 110 detects the voltage LX of the node NLX, when the voltage LX of the node NLX is equal to the first threshold voltage LX1, the second period P2 is entered, meanwhile, the controlling circuit 110 turns off the first switch T1 slowly by using the first control signal with smaller slope during the second period P2.

In other embodiments, the control method 300 of the regulator device 100 further comprises: the controlling circuit 110 detects the voltage LX of the node NLX. When the voltage LX of the node NLX is equal to the second threshold voltage LX2, the controlling circuit 110 prepares to output the second control signal GS2 to turn on the second switch T2. In another embodiment, the control method 300 of the regulator device 100 further comprises: when the controlling circuit 110 receives the enable signal NI for turning on the second switch T2, the third period P3 is entered, and the controlling circuit 110 outputs the second control signal GS2 during the third period P3 in order to turn on the second switch T2, which the first control signal GS1 has turned off the first switch T1 completely.

In one embodiment, the first switch can be but not limited to the P-type transistor and the second switch can be but not limited to the N-type transistor. Please refer to FIG. 1 and FIG. 3, the step 310 further comprises: the controlling circuit 110 provides the first control signal GS1 with the first voltage difference V1 to the first switch T1 during the first period P1. Further, the step 320 further comprises: the controlling circuit 110 provides the first control signal GS1 with the second voltage difference V2 to the first switch T1 during the second period P2, which the first voltage difference V1 is larger than the second voltage difference V2. In another embodiment, the first voltage difference V1 and the second voltage difference V2 are both the positive voltages. The control method 300 of the regulator device 100 further comprises: the controlling circuit 110 provides the first control signal GS1 with high level voltage to the first switch T1 during the third period P3 to turn off the first switch T1 completely.

Through the above embodiments, there are advantages illustrated below. The regulator device and the control method of the present disclosure outputs different control signals based on corresponding periods when they are at the heavy load status. For example, the control signal with smaller slope will be outputted during the second period to prevent the regulator device from occurring the sudden high voltage, hence the lifecycle of the integrated circuit could be enlarged.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A regulator device, comprising:
   a first switch, comprising:
      a first terminal configured to receive an input voltage;
      a control terminal configured to receive a first control signal; and
      a second terminal;
   a second switch, comprising:
      a first terminal coupled with the second terminal of the first switch at a node;
      a control terminal configured to receive a second control signal; and
      a second terminal coupled to a ground terminal; and
   a controlling circuit coupled to the control terminal of the first switch, the control terminal of the second switch and the node, wherein the controlling circuit outputs the first control signal with a first slope to the first switch during a first period, and outputs the first control signal with a second slope to the first switch during a second period according to a decrease in a voltage of the node, wherein the first period is less than the second period, and the first slope is larger than the second slope,
   wherein the control terminal of the second switch receives the second control signal in a third period only and does not receive the second control signal in the first and second periods, wherein the third period is later than the first and second periods;
   wherein when the controlling circuit receives a disable signal for turning off the first switch, the first period is entered, wherein the controlling circuit turns off the first switch by the first control signal with the first slope, which is larger than the second slope, during the first period;
   wherein the controlling circuit is further configured to detect the voltage of the node, when the voltage of the node is equal to a first threshold voltage, the second period is entered, wherein the controlling circuit turns off the first switch by the first signal with the second slope, which is smaller than the first slope, during the second period;

wherein when the voltage of the node is equal to a second threshold voltage, the controlling circuit prepares outputting the second control signal for turning on the second switch.

2. The regulator device of claim 1, wherein when the controlling circuit receives an enable signal for turning on the second switch, the third period is entered, wherein the controlling circuit outputs, during the third period, the second control signal to turn on the second switch.

3. The regulator device of claim 1, wherein the first switch comprises a P-type transistor, wherein the controlling circuit provides, during the first period, the first control signal with a first voltage difference to the first switch.

4. The regulator device of claim 3, wherein the controlling circuit provides, during the second period, the first control signal with a second voltage difference to the first switch, wherein the first voltage difference is larger than the second voltage difference.

5. The regulator device of claim 4, wherein the first voltage difference and the second voltage difference are positive voltages.

6. The regulator device of claim 5, wherein the controlling circuit provides, during the third period, the first control signal with a high level voltage to the first switch to turn off the first switch completely.

7. The regulator device of claim 1, wherein when the regulator device is at a heavy load status, the controlling circuit outputs the first control signal with the first slope to the first switch during the first period, and outputs the first control signal with the second slope to the first switch during the second period.

8. A method of controlling a regulator device, wherein the regulator device comprises a first switch, a second switch, and a controlling circuit, a control terminal of the first switch configured to receive a first control signal, a first terminal of the second switch coupled with a second terminal of the first switch at a node, a control terminal of the second switch configured to receive a second control signal, wherein the method comprises:

outputting, by the controlling circuit, the first control signal with a first slope to the first switch during a first period; and outputting, by the controlling circuit, the first control signal with a second slope to the first switch during a second period according to a decrease in a voltage of the node, wherein the first period is less than the second period, and the first slope is larger than the second slope, wherein the control terminal of the second switch receives the second control signal in a third period only and does not receive the second control signal in the first and second periods, wherein the third period is later than the first and second periods;

wherein the method further comprises:

entering the first period when the controlling circuit receives a disable signal for turning off the first switch, wherein the first switch is turned off by the controlling circuit using the first control signal with the first slope, which is larger than the second slope, during the first period;

detecting the voltage of the node by the controlling circuit, and entering the second period when the voltage of the node is equal to a first threshold voltage, wherein the first switch is turned off by the controlling circuit using the first control signal with the second slope, which is less than the first slope, during the second period; and detecting the voltage of the node by the controlling circuit, wherein when the voltage of the node is equal to a second threshold voltage, the controlling circuit prepares outputting the second control signal for turning on the second switch.

9. The method of claim 8, further comprising:

entering the third period when the controlling circuit receiving an enable signal for turning on the second switch, wherein the second control signal is outputted by the controlling circuit to turn on the second switch during the third period, which the first switch has been turned off completely by the first control signal.

10. The method of claim 8, wherein the first switch comprises a P-type transistor, wherein outputting the first control signal to the first switch by the controlling circuit during the first period comprises:

providing, by the controlling circuit, the first control signal with a first voltage difference to the first switch during the first period.

11. The method of claim 10, wherein outputting, by the controlling circuit, the first control signal to the first switch during the second period comprises:

providing, by the controlling circuit, the first control signal with a second voltage difference to the first switch during the second period, wherein the first voltage difference is larger than the second voltage difference.

12. The method of claim 11, wherein the first voltage difference and the second voltage difference are positive voltages.

13. The method of claim 12, further comprising:

providing, by the controlling circuit, the first control signal with a high level voltage to the first switch during the third period to turn off the first switch completely.

14. The method of claim 8, wherein outputting, by the controlling circuit, the first control signal with the first slope to the first switch during the first period comprises:

outputting, by the controlling circuit, the first signal of the first slope to the first switch during the first period in response to a heavy load status of the regulator device.

* * * * *